(12) United States Patent
Shutkin et al.

(10) Patent No.: US 11,265,014 B2
(45) Date of Patent: Mar. 1, 2022

(54) METHOD AND APPARATUS FOR ENCODING AND DECODING LDPC CODES

(71) Applicant: Huawei Technologies Co., Ltd., Shenzhen (CN)

(72) Inventors: Yurii Sergeevich Shutkin, Moscow (RU); Pavel Anatolyevich Panteleev, Moscow (RU); Aleksey Alexandrovich Letunovskiy, Moscow (RU); Elyar Eldarovich Gasanov, Moscow (RU); Gleb Vyacheslavovich Kalachev, Moscow (RU); Ivan Leonidovich Mazurenko, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 4 days.

(21) Appl. No.: 16/749,453

(22) Filed: Jan. 22, 2020

(65) Prior Publication Data

US 2020/0162107 A1    May 21, 2020

Related U.S. Application Data

(63) Continuation of application No. 16/400,877, filed on May 1, 2019, now Pat. No. 10,567,002, which is a
(Continued)

(30) Foreign Application Priority Data

Nov. 3, 2016   (WO) ................ PCT/RU2016/000746

(51) Int. Cl.
*H03M 13/00*    (2006.01)
*H03M 13/11*    (2006.01)
*H04L 1/00*     (2006.01)

(52) U.S. Cl.
CPC ........ *H03M 13/116* (2013.01); *H03M 13/114* (2013.01); *H03M 13/1137* (2013.01);
(Continued)

(58) Field of Classification Search
CPC ............. H03M 13/116; H03M 13/114; H03M 13/1137; H03M 13/618; H03M 13/6362
See application file for complete search history.

(56) References Cited

U.S. PATENT DOCUMENTS 7,051,269 B1   5/2006   Hindelang et al.
7,127,659 B2   10/2006  Richardson et al.
(Continued)

FOREIGN PATENT DOCUMENTS

CN   102904583 A   1/2013
CN   104868925 A   8/2015
(Continued)

OTHER PUBLICATIONS

"Consideration on LDPC design for NR," 3GPP TSG-RAN WG1#86bis, Lisbon Portugal, R1-1608974, total 13 pages, 3rd Generation Partnership Project, Valbonne, France (Oct. 10-14, 2016).
(Continued)

*Primary Examiner* — Esaw T Abraham
(74) *Attorney, Agent, or Firm* — Leydig, Voit & Mayer, Ltd.

(57) ABSTRACT

Certain aspects of the present disclosure provide an efficiently decodable QC-LDPC code which is based on a base matrix, the base matrix being formed by columns and rows, the columns being dividable into one or more columns corresponding to punctured variable nodes and columns corresponding to non-punctured variable nodes. Apparatus at a transmitting side includes a encoder configured to encode a sequence of information bits based on the base matrix. Apparatus at a receiving side configured to receive
(Continued)

a codeword in accordance with a radio technology across a wireless channel. The apparatus at the receiving side includes a decoder configured to decode the codeword based on the base matrix.

20 Claims, 12 Drawing Sheets

Related U.S. Application Data continuation of application No. PCT/CN2017/086017, filed on May 25, 2017.

(52) U.S. Cl.
CPC ....... *H03M 13/616* (2013.01); *H03M 13/618* (2013.01); *H03M 13/6362* (2013.01); *H03M 13/6393* (2013.01); *H03M 13/6502* (2013.01); *H03M 13/6516* (2013.01); *H03M 13/6561* (2013.01); *H04L 1/0041* (2013.01)

(56) References Cited

U.S. PATENT DOCUMENTS

| | | | |
|---|---|---|---|
| 7,333,546 B2 | 2/2008 | Kim et al. | |
| 7,376,883 B2 | 5/2008 | Eroz et al. | |
| 7,747,934 B2* | 6/2010 | Livshitz | H03M 13/1137 714/800 |
| 7,757,150 B2* | 7/2010 | Stolpman | H03M 13/6362 714/752 |
| 7,783,961 B2 | 8/2010 | Yue et al. | |
| 7,969,332 B2 | 6/2011 | Xu et al. | |
| 8,060,796 B2 | 11/2011 | Wang et al. | |
| 8,281,209 B2 | 10/2012 | Xu et al. | |
| 8,321,745 B2* | 11/2012 | Myung | H03M 13/618 714/752 |
| 8,375,278 B2 | 2/2013 | Sharon et al. | |
| 8,418,023 B2* | 4/2013 | Gunnam | H03M 13/1177 714/758 |
| 8,473,827 B2* | 6/2013 | Murakami | H03M 13/15 714/790 |
| 8,533,556 B2* | 9/2013 | Myung | H03M 13/6362 714/752 |
| 8,739,001 B2* | 5/2014 | Tsatsaragkos | H03M 13/033 714/776 |
| 9,094,044 B2* | 7/2015 | Murakami | H03M 13/1125 |
| 9,178,653 B2* | 11/2015 | Shen | H04L 1/0057 |
| 9,264,972 B2* | 2/2016 | Fan | H04L 12/5692 |
| 9,397,699 B2 | 7/2016 | Sharon et al. | |
| 9,432,052 B2* | 8/2016 | Korb | H03M 13/616 |
| 9,464,928 B2 | 10/2016 | Debski | |
| 9,680,590 B2 | 6/2017 | Park | |
| 2005/0283709 A1 | 12/2005 | Kyung et al. | |
| 2007/0089027 A1 | 4/2007 | Lim et al. | |
| 2008/0126908 A1 | 5/2008 | Lin | |
| 2008/0155385 A1 | 6/2008 | Jeong et al. | |
| 2009/0183047 A1 | 7/2009 | Lampe et al. | |
| 2009/0204868 A1 | 8/2009 | Park et al. | |
| 2011/0047433 A1 | 2/2011 | Abu-Surra et al. | |
| 2013/0086445 A1 | 4/2013 | Yedidia et al. | |
| 2014/0229788 A1 | 8/2014 | Richardson | |
| 2015/0006989 A1 | 1/2015 | Doi et al. | |

FOREIGN PATENT DOCUMENTS

| | | |
|---|---|---|
| EP | 2091171 A2 | 8/2009 |
| JP | 2019532585 A | 11/2019 |
| KR | 100739510 B1 | 7/2007 |
| KR | 101433375 B1 | 8/2014 |
| KR | 101445080 B1 | 9/2014 |
| RU | 2348103 C2 | 2/2009 |

OTHER PUBLICATIONS

Li et al., "Efficient Puncturing Scheme for Irregular LDPC Codes Based on Serial Schedules," IEEE Communications Letters, vol. 19, No. 9, total 5 pages, Institute of Electrical and Electronics Engineers, New York, New York (Sep. 2015).

"LDPC design for eMBB," 3GPP TSG RAN WG1 #89, Hangzhou, P.R. China, R1-1708829, total 6 pages, 3rd Generation Partnership Project, Valbonne, France (May 15-19, 2017).

Liu et al.,"The serial message-passing schedule for LDPC decoding algorithms," pp. 1-7, Event: Seventh International Conference on Graphic and Image Processing,2015, Singapore, Singapore (2015).

"5G", form Wikipedia, https://en.wikipedia.org/wiki/5G, pp. 1-8 (last edited on May 20, 2019).

"Hybrid automatic repeat request," From Wikipedia, https://en.wikipedia.org/wiki/Hybrid_automatic_repeat_request, pp. 1-4 (May 21, 2015).

"Part 16: Air Interface for Fixed and Mobile Broadband Wireless Access Systems; Amendment 2: Physical and Medium Access Control Layers for Combined Fixed and Mobile Operation in Licensed Bands and Corrigendum 1," pp. 1-864, IEEE Std 802.16e™—2005, Institute of Electrical and Electronics Engineers—New York, New York (Feb. 28, 2006).

"Part 11: Wireless LAN Medium Access Control (MAC) and Physical Layer (PHY) Specifications Amendment 3: Enhancements for Very High Throughput in the 60 GHz Band," pp. 1-628, IEEE Std 802.11ad™—2012, Institute of Electrical and Electronics Engineers—New York, New York (Dec. 28, 2012).

Xiao et al., "Improved Progressive-Edge-Growth (PEG) Construction of Irregular LDPC Codes," IIEEE Communications Society, Globecom 2004, vol. 8, No. 12, pp. 489-492, Institute of Electrical and Electronics Engineers—New York, New York (Dec. 2004).

Jin et al., "Irregular Repeat-Accumulate Codes," pp. 1-8, Department of Electrical Engineering, California Institute of Technology, Pasadena, CA 91125 USA (Sep. 2000).

Gallager, "Low-Density Parity-Check Codes," pp. 1-90, IRE Trans, Information Theory (Jan. 1962).

Park et al.,"Low-Power High-Throughput LDPC Decoder Using Non-Refresh Embedded DRAM," IEEE Journal of Solid-State Circuits, vol. 49, No. 3, pp. 783-794, Institute of Electrical and Electronics Engineers—New York, New York (Mar. 2014).

Yazdani et al.,"On Construction of Rate-Compatible Low-Density Parity-Check Codes," IEEE Communications Letters, vol. 8, No. 3, pp. 159-161, Institute of Electrical and Electronics Engineers—New York, New York (Mar. 2004).

Chen et al.,"Protograph-Based Raptor-Like LDPC Codes," IEEE Transactions on Communications, vol. 63, No. 5, pp. 1522-1531, Institute of Electrical and Electronics Engineers—New York, New York (May 2015).

"Quadrature amplitude modulation," From Wikipedia, https://en.wikipedia.org/wiki/Quadrature_amplitude_modulation, pp. 1-3 (last edited on May 20, 2019).

Lee et al.,"Two Informed Dynamic Scheduling Strategies for Iterative LDPC Decoders," IEEE Transactions on Communications, vol. 61, No. 3, pp. 886-896, Institute of Electrical and Electronics Engineers—New York, New York (Mar. 2013).

Tanner,"A Recursive Approach to Low Complexity Codes," IEEE Transactions on Information Theory, vol. IT-27, No. 5, pp. 533-547, Institute of Electrical and Electronics Engineers—New York, New York (Sep. 1981).

Fossorier, "Quasi-Cyclic Low-Density Parity-Check Codes From Circulant Permutation Matrices," IEEE Transactions on Information Theory, vol. 50, No. 8, pp. 1788, Institute of Electrical and Electronics Engineers—New York, New York (Aug. 2004).

"Design of LDPC code for high throughput," 3GPP TSG RAN WG1 #85, R1-164813, Nanjing, China, pp. 1-3, 3rd Generation Partnership Project—Valbonne, France (May 23-27, 2016).

"LDPC rate compatible design," 3GPP TSG-RAN WG1 #86, R1-166370, pp. 1-26, Gothenburg, Sweden, 3rd Generation Partnership Project—Valbonne, France (Aug. 22-26, 2016).

(56) References Cited

OTHER PUBLICATIONS

"LDPC rate compatible design," 3GPP TSG-RAN WG1 #86 R1-166388, pp. 1-26, Gothenburg, Sweden, 3rd Generation Partnership Project—Valbonne, France (Aug. 22-26, 2016).
"Design of Flexible LDPC Codes",3GPP TSG RAN WG1 #86, R1-167889, pp. 1-5, Gothenburg, Sweden, 3rd Generation Partnership Project—Valbonne, France (Aug. 22-26, 2016).
Hu et al.,"Regular and Irregular Progressive Edge-Growth Tanner Graphs," IEEE Transactions on Information Theory, vol. 51, No. 1, pp. 386-398, Institute of Electrical and Electronics Engineers—New York, New York (Jan. 2005).
Richardson et al.,"The Capacity of Low-Density Parity-Check Codes Under Message-Passing Decoding," IEEE Transactions on Information Theory, vol. 47, No. 2, pp. 599-617, Institute of Electrical and Electronics Engineers—New York (Feb. 2001).
"The Mobile Broadband Standard," http://www.3gpp.org/, pp. 1-2 (accessed on May 21, 2019).
Bates, "Using Rate-Adaptive LDPC Codes to Maximize the Capacity of SSDs," pp. 1-12, Flash Memory Summit 2013 (2013).
"Draft Standard for Information Technology—Telecommunications and Information Exchange Between Systems—Local and Metropolitan Area Networks—Specific Requirements—Part 11: Wireless LAN Medium Access Control (MAC) and 10 Physical Layer (PHY) Specifications—Amendment 3: Enhancements for Very High Throughput in the 60 GHz Band," IEEE P802.11ad/D9.0, pp. 1-679, Institute of Electrical and Electronics Engineers—New York (Jul. 2012).
Sharon et al.,"An Efficient Message-Passing Schedule for LDPC Decoding," pp. 223-226, Institute of Electrical and Electronics Engineers, New York, New York (2004).
Vukobratovic et al.,"ACE Spectrum of LDPC Codes," pp. 33-40, Journal of Automatic Control, University of Belgrade, vol. 16:33-36 (2006).
Richardson et al, "Multi-Edge Type LDPC Codes," pp. 1-34 (Apr. 20, 2004).
Divsalar et al.,"Capacity-Approaching Protograph Codes," IEEE Journal on Selected Areas in Communications, vol. 27, No. 6, pp. 876-888, Institute of Electrical and Electronics Engineers—New York (Aug. 2009).
Paolini et al.,"Low-Density Parity-Check Code Constructions," pp. 141-209, Chapter 3 of Channel Coding: Theory, Algorithms, and Applications (Jul. 2014).
Richardson et al.,"Efficient Encoding of Low-Density Parity-Check Codes," IEEE Transactions on Information Theory, vol. 47, No. 2, pp. 638-655, Institute of Electrical and Electronics Engineers—New York (Feb. 2001).
"Enhanced HARQ Method with Signal Constellation Rearrangement," TSG-RAN Working Group 1 Meeting #19 TSGR1#19(01)0237, pp. 1-11, Las Vegas, USA (Feb. 27-Mar. 2, 2001).
Richardson et al.,"Error Floors of LDPC Codes," pp. 1426-1435, in Proc. 41st Allerton Conf. Comm., Control, and Comput., Monticello, IL (2003).
MacKay et al., "Good Codes based on Very Sparse Matrices," Cryptography and Coding, 5th IMA Conf., C. Boyd, Ed., Lecture Notes in Computer Science, pp. 1-13, Berlin, Germany (1995).
U.S. Appl. No. 16/400,877, filed May 1, 2019.
Fossorier et al., "Reduced Complexity Iterative Decoding of Low-Density Parity Check Codes Based on Belief Propagation," IEEE Transactions on Communications, vol. 47, No. 5, pp. 673-680, Institute of Electrical and Electronics Engineers, New York, New York (May 1999).
Chen et al., "Improved Min-Sum Decoding Algorithms for Irregular LDPC codes," Proceedings. International Symposium on Information Theory, 2005. ISIT 2005., Total 5 pages, Institute of Electrical and Electronics Engineers, New York, New York (Sep. 4-9, 2005).

\* cited by examiner

| Clocks | A | B | C | D | E | F | G | H | I |
|--------|-----|-----|-----|-----|-----|-----|-----|-----|-----|
| 1 | 1-2 | | | | | | | | |
| 2 | | 1-2 | | 1-2 | 1-2 | | | | |
| 3 | | | 1-2 | | | 1-2 | 1-2 | 1-2 | 1-2 |
| 4 | 3-4 | | | | | | | | |
| 5 | | 3-4 | | 3-4 | 3-4 | | | | |
| 6 | | | 3-4 | | | 3-4 | 3-4 | 3-4 | 3-4 |
| 7 | 5-6 | | | | | | | | |
| 8 | | 5-6 | | 5-6 | 5-6 | | | | |
| 9 | | | 5-6 | | | 5-6 | 5-6 | 5-6 | 5-6 |
| 10 | 1-2 | | | 1-2 | 1-2 | | | | |
| 11 | | 1-2 | | | | | | | |
| 12 | | | 1-2 | | | 1-2 | 1-2 | 1-2 | |

Fig.11

| Clocks | A | B | C | D | E | F | G | H | I |
|---|---|---|---|---|---|---|---|---|---|
| 1 | 1.1 | | | | | | | | |
| 2 | 1.2 | 1.1 | | 1-2 | 1 | | | | |
| 3 | 2.1 | 1.2 | 1.1 | | 2 | 1-2 | | | |
| 4 | 2.2 | 2.1 | 1.2 | | | | 1-2 | 1-2 | 1-2 |
| 5 | 3.1 | 2.2 | 2.1 | | 3 | | | | |
| 6 | 3.2 | 3.1 | 2.2 | 3-4 | 4 | 3-4 | | | |
| 7 | 4.1 | 3.2 | 3.1 | | | | 3-4 | 3-4 | 3-4 |
| 8 | 4.2 | 4.1 | 3.2 | | | | | | |
| 9 | 5.1 | 4.2 | 4.1 | | 5 | | | | |
| 10 | 5.2 | 5.1 | 4.2 | 5-6 | 6 | 5-6 | | | |
| 11 | 6.1 | 5.2 | 5.1 | | | | 5-6 | 5-6 | 5-6 |
| 12 | 6.2 | 6.1 | 5.2 | | | | | | |
| 13 | 1.1 | 6.2 | 6.1 | 1-2 | 1 | | | | |
| 14 | 1.2 | 1.1 | 6.2 | | 2 | 1-2 | | | |
| 15 | 2.1 | 1.2 | 1.1 | | | | | | |

Fig.12

METHOD AND APPARATUS FOR ENCODING AND DECODING LDPC CODES

CROSS-REFERENCE TO RELATED APPLICATIONS

This application is a continuation of U.S. patent application Ser. No. 16/400,877 (now issued as U.S. Pat. No. 10,567,002), filed on May 1, 2019, which is a continuation of International Application No. PCT/CN2017/086017, filed on May 25, 2017, which claims priority of International Application No. PCT/RU2016/000746, filed on Nov. 3, 2016. All of the afore-mentioned patent applications are hereby incorporated by reference in their entireties.

TECHNICAL FIELD

Embodiments of the present disclosure relate to the communications field and in particular to techniques for encoding and decoding data.

BACKGROUND

Low density parity check (LDPC) codes are channel codes used in forward error correcting (FEC) schemes. LDPC codes are well known for their good performance and have received a great deal of attention in recent years. This is due to their ability to achieve performance close to the Shannon limit, the ability to design codes which achieve high parallelization in hardware, and their support of high data rates. Consequently, many of the currently active telecommunication standards have LDPC codes in their physical layer FEC scheme. LDPC codes are considered to be the next-generation communication system encoding standard.

Quasi-Cyclic Low-Density Parity-Check (QC-LDPC) code is based on a base matrix of an irregular QC-LDPC matrix, the base matrix being formed by columns and rows, the columns being dividable into one or more columns corresponding to punctured variable nodes (i.e. variable nodes corresponding to information bits which are used by the encoder but are not transmitted to or effectively treated as not received by the decoder) and columns corresponding to not-punctured (non-punctured) variable nodes, and the rows being dividable into high-density rows (i.e. rows having a weight which is above a first weight) and low-density rows (i.e. rows having a weight which is below a second weight, wherein the second weight is equal to or smaller than the first weight).

While known approaches to channel coding have proven to perform well for a wide variety of scenarios, there is still an ongoing research to provide sophisticated solutions that achieve high data throughput with decent encoding/decoding resources.

SUMMARY

According to a first aspect of the present disclosure, there is provided a method, the method comprising providing entries of a base matrix of an irregular QC-LDPC code for encoding or decoding a sequence of information bits, wherein the entries represent blocks of an irregular QC-LDPC matrix and each block represents a shifted circulant matrix or a zero matrix, dividing the rows of the base matrix into a first set and a second set, wherein the rows of the first set have a higher weight than the rows of the second set, selecting a number of columns of a matrix formed by the rows of the second set, wherein rows of a submatrix formed by the selected columns are divided into different groups, each group consisting of a maximum number of orthogonal rows, wherein the selecting is based on a number of different groups, and indicating information bits corresponding to not-selected columns as punctured.

Puncturing the information bits corresponding to one or more a high weight columns of the irregular QC-LDPC matrix allows for layered decoding with regard to the different groups of "remaining" orthogonal subrows (or row-vectors) in combination with flooding decoding with regard to the high weight columns, thereby achieving a high degree of parallelism during decoding while maintaining high quality code. Thus, selecting columns that are not to be punctured strives at keeping the number of different groups of orthogonal subrows (or row-vectors) as high as possible while avoiding that information bits corresponding to too many columns (e.g., more than given by a threshold) are to be punctured.

In this regard, it is noted that the term "circulant matrix" as used throughout the description and claims in particular refers to a quadratic matrix of size N×N, e.g., the identity matrix, where each row vector is shifted one element to the right relative to the preceding row vector. Moreover, the term "circulant size" refers to the size N of the circulant. Furthermore, the term "base matrix" as used throughout the description and claims in particular refers to an array labelled with shift values. Each shift value of the base matrix gives the number of times by which the rows of the circulant, e.g., the identity matrix, are to be cyclically (right-) shifted to generate a corresponding submatrix of the QC-LDPC matrix defined by the base matrix.

Moreover, it is noted that QC-LDPC code and LDPC code are often used alternately, but a person skilled in the art can understand their meanings. The term "weight" as used throughout the description and claims in particular refers to the number of entries in a row or column of the base matrix that are labelled with shift values, i.e. the entries in the rows or columns of the base matrix that do not represent zero matrices, which is equal to the number of "1 s" in the corresponding rows and columns of the QC-LDPC matrix. In this regard, it is noted that the term "weight" as used throughout the description and claims can be interchanged by the terms "node degree" or "density" which have the same or a similar meaning. Furthermore, the term "punctured" as used throughout the description and claims in relation to information bits (or the corresponding variable nodes or the corresponding columns) in particular indicates that the information bits are only used by the encoder but are not transmitted to or effectively treated as not received by the decoder. Even further, the term "corresponding" as used throughout the description and claims in relation to columns, nodes, and information bits in particular refers to the mapping between columns and variable nodes/information bits in terms of the Tanner graph representation of the QC-LDPC matrix.

Furthermore, it is to be noted that values forming a "matrix" do not necessarily have to be physically stored or presented in matrix- (or array-) form, or used in matrix algebra throughout a process involving the matrix. Rather the term "matrix" as used throughout the description and claims may equally refer to a set of (integer) values with assigned row and column indices or to a set of (integer) values which are stored in a (logical) memory array. Moreover, if not involving matrix algebra or if respective matrix algebra routines are suitably redefined, the notion of rows and columns may even be changed or freely chosen. However, throughout the description and claims, it is adhered to the mathematical concepts and notations regularly used in the art and they shall be understood as encompassing equivalent mathematical concepts and notations.

In a first possible implementation form of the method according to the first aspect, the number of not-selected columns is one or two.

Hence, there may be a relatively small number of not-selected columns which, however, have a relatively high weight (e.g., more than two times or three times the mean weight of the selected columns) thereby providing good "connectivity" of the groups of orthogonal subrows (or row vectors) while effectively allowing for a high degree of parallelism during decoding due to the relatively small number of columns which have to be "separated" (or divided into non-overlapping sets or groups) to achieve orthogonality within the groups of remaining (selected) subrows (or row vectors).

In a second possible implementation form of the method according to the first aspect as such or according to the first implementation form of the first aspect, selecting the number of columns of the matrix formed by the rows of the second set comprises ordering or grouping the columns of the matrix formed by the rows of the second set by weight and selecting columns having weights below a threshold.

Thus, groups with a large number of orthogonal subrows (or row vectors) can be achieved, which allows for a higher degree of parallelism during decoding.

In a third possible implementation form of the method according to the first aspect as such or according to the first or second implementation form of the first aspect, a matrix consisting of a subset of columns of a matrix formed by the rows of the first set has a dual diagonal or triangular structure.

Hence, the high-density part of the irregular QC-LDPC matrix facilitates encoding by having a parity part with a dual diagonal or triangular structure. This also improves the susceptibility of the code to rate-adaptiveness as the number of rows (and corresponding columns if, for example, removing a row would leave an empty column) removed from the low-density part allows to change the rate of the code without, however, effectively touching on the encoding/decoding properties of the high-density part. In this regard, the method may also comprise removing a number of rows (and corresponding columns) of the second set of the irregular QC-LDPC matrix to adapt a rate of the irregular QC-LDPC code.

In a fourth possible implementation form of the method according to the first aspect as such or according to any one of the first to the third implementation forms of the first aspect, a matrix consisting of a subset of columns of the matrix formed by the rows of the second set has a triangular or identity matrix structure.

Thus, encoding may be performed in a two-step procedure comprising encoding an input sequence based on subcolumns (or column vectors) of the high-density part and encoding the encoded output sequence based on subcolumns (or column vectors) of the low-density part, thereby utilizing a raptor-like encoding process.

In a fifth possible implementation form of the method according to the first aspect as such or according to any one of the first to the fourth implementation forms of the first aspect, rows of a matrix formed by columns of the matrix formed by the rows of the first set which correspond to non-punctured information bits are divided into different groups, each group consisting of orthogonal rows.

Hence, groups (or subsets) of orthogonal subrows (or row vectors) can be formed in the high-density set and in the low-density set which allows for an even higher degree of parallelism during decoding.

In a sixth possible implementation form of the method according to the first aspect as such or according to any one of the first to the fifth implementation forms of the first aspect, the method further comprises determining a codeword corresponding to the sequence of information bits based on the provided entries of the base matrix and transmitting the codeword except for information bits that are indicated as punctured.

Thus, a rate of the QC-LDPC code can be increased.

In a seventh possible implementation form of the method according to the first aspect as such or according to any one of the first to the sixth implementation forms of the first aspect, the method further comprises decoding a received sequence of information bits based on the provided entries of the base matrix and information about which information bits are punctured, wherein the decoding comprises flooding and layered decoding operations, wherein layers correspond to the different groups.

Thus, decoding convergence can be improved while maintaining high parallelism of the decoding process. In this regard, it is noted that the term "layered decoding" as used throughout the description and claims in particular refers to a decoding process where rows of a layer are processed in parallel but layers are processed (substantially) consecutively.

According to a second aspect of the present disclosure, there is provided a decoder, the decoder comprising a non-transient memory storing entries of a base matrix of an irregular QC-LDPC code, wherein columns of the base matrix are divided into a first set and a second set, the first set comprising one or more columns and the columns of the second set forming a matrix comprising groups of orthogonal rows, wherein the decoder is configured to decode a received sequence of information bits based on a flooding decoding process for variable nodes corresponding to the one or more columns of the first set and a layered decoding process for nodes corresponding to the columns of the second set.

Thus, decoding convergence can be improved while allowing to maintain code quality and high parallelism of the decoding process, thereby enabling high throughput at a low error rate.

In a first possible implementation form of the decoder according to the second aspect, the variable nodes corresponding to the one or more columns of the first set are indicated as punctured.

Thus, a rate of the irregular QC-LDPC code can be increased.

In a second possible implementation form of the decoder according to the second aspect as such or according to the first implementation form of the second aspect, the number of columns in the first set is one or two.

Hence, there may be a relatively small number of columns in the first set which, however, may have a relatively high weight (e.g., more than two times or three times the mean weight of the columns of the second set) thereby improving the "connectivity" of the layers.

In a third possible implementation form of the decoder according to the second aspect as such or according to the first or second implementation form of the second aspect, rows of the base matrix are divided into a first set and a second set, wherein the rows of the first set have a higher weight than the rows of the second set.

This makes the code even more susceptible to rate adaption by removing (or disregarding) rows of the second set (and corresponding columns of the second set) without substantially deteriorating quality of the code.

In a fourth possible implementation form of the decoder according to the third implementation form of the second aspect, a matrix consisting of a subset of columns of a matrix formed by the rows of the first set has a dual diagonal or triangular structure.

Hence, the high-density part of the irregular QC-LDPC matrix facilitates encoding by having a parity part with a dual diagonal or triangular structure.

In a fifth possible implementation form of the decoder according to the third or fourth implementation form of the second aspect, a matrix consisting of a subset of columns of the matrix formed by the rows of the second set has a triangular or identity matrix structure.

Thus, encoding may be performed utilizing a raptor-like encoding process which reduces or obviates the need for requesting retransmissions by the decoder.

In a sixth possible implementation form of the decoder according to any one of the third to fifth implementation forms of the second aspect, rows of a matrix formed by overlapping entries of the columns of the second set and the rows of the first set are divided into different groups, each group consisting of orthogonal rows.

Hence, a higher degree of parallelism during decoding can be achieved.

According to a third aspect of the present disclosure, there is provided a non-transient computer-readable medium storing instructions which, when carried out by a computer cause the computer to provide a base matrix of an irregular QC-LDPC matrix, the base matrix being formed by columns and rows, the columns being dividable into one or more columns corresponding to punctured variable nodes and columns corresponding to not-punctured (non-punctured) variable nodes, and the rows being dividable into first rows having a weight which is above a first weight and second rows having a weight which is below a second weight, wherein the second weight is equal to or smaller than the first weight, wherein an overlap of the second rows and the columns corresponding to the not-punctured (non-punctured) variable nodes is dividable into groups of orthogonal row-vectors.

Puncturing the variable nodes corresponding to one or more a high weight columns of the base matrix of the irregular QC-LDPC matrix allows for layered decoding with regard to the different groups of "remaining" orthogonal subrows (or row-vectors) in combination with flooding decoding with regard to the high weight columns, thereby achieving a high degree of parallelism during decoding while maintaining high quality code.

BRIEF DESCRIPTION OF THE DRAWINGS

FIG. 5 shows a base matrix of an irregular QC-LDPC code;

FIG. 6 is a base graph of a base matrix;

FIG. 7 is another base graph of a base matrix;

FIG. 11 shows a schedule of a first hardware implementation of the decoding process; and FIG. 12 shows a schedule of a second hardware implementation of the decoding process.

DETAILED DESCRIPTION

Figure 1:
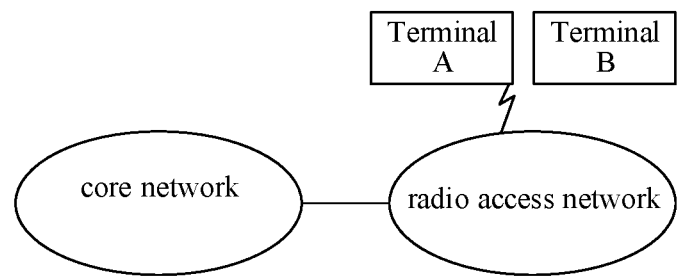
FIG. 1 shows a schematic diagram of a possible application scenario according to embodiments of the present disclosure.

FIG. 1 shows a possible application scenario according to the present disclosure. As As shown in FIG. 1, at least one of terminal (such as, user equipment, UE) is connected to a radio access network (RAN) and a core network (CN). The technology described in the present disclosure may be applied to 5G communication system, or other wireless communications systems that use various radio access technologies, for example, systems that use Code Division Multiple Access, Frequency Division Multiple Access, Time Division Multiple Access, orthogonal frequency division multiple access, single carrier frequency division multiple access, and other radio access technologies. In addition, the technology described in the present disclosure may be further applied to an evolved communication system. In a possible implementation, the terminal can connect to an IP multimedia subsystem network through the radio access network and the core network.

The term "terminal" involved in embodiments of the present disclosure may include a hand device, an in-vehicle device, a wearable device, a computing device, or another processing device connected to a wireless modem, where the device has a wireless communication function, and various forms of user equipments (UE), mobile stations (MS), terminals, terminal equipment, and the like.

The radio access network comprising at least one base station. A base station (BS) is an apparatus that is deployed in a radio access network and that is configured to provide a wireless communication function for UE. The base station may include various forms of macro base stations, micro base stations, relay stations, access points, and the like. For different radio access technologies, names of a device having a function of a base station may be different.

Figure 2:
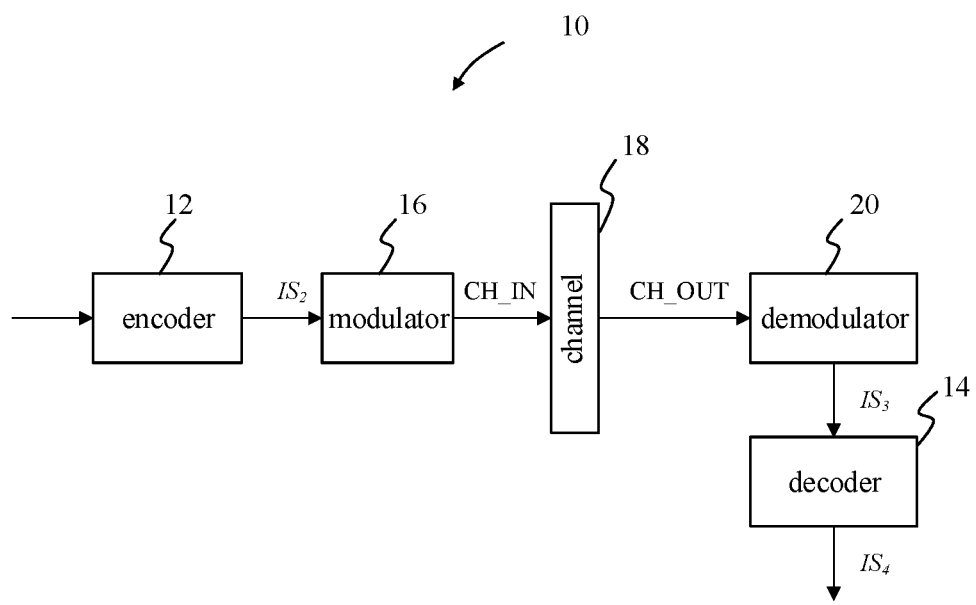
FIG. 2 shows a schematic illustration of a digital communication system.

FIG. 2 shows a block diagram illustrating a digital communications system 10 in which processes of the present disclosure may be implemented. The digital communications system 10 includes a transmitting side comprising an encoder 12 and a receiving side comprising a decoder 14. The encoder or the decoder may be implemented by at least one processor, for example, implemented by a chipset. The at last one processor or the chipset can be installed in a base station or a terminal. The input of the encoder 12 at the transmitting side is, for example, an information sequence $IS_1$ of k bits to which a redundancy sequence of r bits is added in an encoding operation performed by the encoder 12, thereby producing an encoded information sequence $IS_2$ of k+r=n bits which may be forwarded to a modulator 16.

The modulator 16 may transform the encoded sequence $IS_2$ into a modulated signal vector CH_IN which is in turn transmitted through a wired or wireless channel 18 such as, for example, a conductive wire, an optical fiber, a radio channel, a microwave channel or an infrared channel. Since the channel 18 is usually subject to noisy disturbances, the channel output CH_OUT may differ from the channel input CH_IN.

At the receiving side, the channel output vector CH_OUT may be processed by a demodulator 20 which produces some likelihood ratio. The decoder 14 may use the redundancy in the received information sequence $IS_3$ in a decoding operation performed by the decoder 14 to correct errors in the received information sequence $IS_3$ and produce a decoded information sequence $IS_4$ (cf. M. P. C. Fossorier et al., "Reduced Complexity Iterative Decoding of Low-Density Parity Check Codes Based on Belief Propagation", IEEE TRANSACTIONS ON COMMUNICATIONS, May 1999, Volume 47, Number 5, Pages 673-680, and J. Chen et al., "Improved min-sum decoding algorithms for irregular LDPC codes", PROCEEDINGS OF THE 2005 IEEE INTERNATIONAL SYMPOSIUM ON INFORMATION THEORY, Pages 449-453, September 2005). The decoded information sequence $IS_4$ is an estimate of the encoded information sequence $IS_2$ from which (an estimate of) the information sequence $IS_1$ can be extracted.

The encoding operation and the decoding operation may be governed by an LDPC code. In the general formulation of channel coding, an LDPC code may employ a generator matrix G for the encoding operation performed by the encoder 12 and a parity-check matrix H for the decoding operation performed by the decoder 14. For an LDPC code with an information sequence $IS_1$ of size 1×k, a codeword $IS_2$ of size 1×n, and a redundancy (parity) sequence of r=(n−k) bits, the generator matrix G has size k×n and the parity-check matrix H has size r×n=(n−k)×n.

The parity-check matrix $H_{r \times n}$ and the generator matrix $G_{k \times n}$ enjoy the orthogonality property, which states that for any generator matrix $G_{k \times n}$ with k linearly independent rows there exists a parity-check matrix $H_{r \times n}$ with r=(n−k) linearly independent rows. Thus, any row of the generator matrix $G_{k \times n}$ is orthogonal to the rows of the parity-check matrix $H_{r \times n}$ such that the following equation is satisfied:

$$G_{k \times n} \cdot HT_{n \times r}^T = 0 \quad (1)$$

The encoding operation can be performed by means of a multiplication between the information sequence $IS_1$ and the generator matrix $G_{k \times n}$, wherein the result of the multiplication is the encoded information sequence $IS_2$:

$$IS_2 = IS_1 \cdot G_{k \times n} \quad (2)$$

At the receiving side, due to the orthogonality property between the generator matrix $G_{k \times n}$ and the parity-check matrix $H_{r \times n}$, the following equation should be satisfied:

$$H_{r \times n} \cdot IS_4^T = 0 \quad (3)$$

where $IS_4$ is the decoded received information sequence of size 1×n. If the above equation is verified, the information sequence estimate $IS_4$ may be assumed to be correct.

Once the parity-check matrix $H_{r \times n}$ is generated, it is possible to obtain the generator matrix $G_{k \times n}$ and vice versa. Accordingly, any process of determining a parity-check matrix $H_{r \times n}$ may be mapped to an equivalent process of obtaining a generator matrix $G_{k \times n}$ and vice versa, so that any process disclosed throughout the description and claims in relation to determining a parity-check matrix $H_{r \times n}$ shall be understood as encompassing the equivalent process of obtaining a generator matrix $G_{k \times n}$ and vice versa.

Moreover, it should be noted that LDPC codes having a parity-check matrix $H_{r \times n}$ of a particular structure such as, for example, a parity-check matrix $H_{r \times n}$ having a parity part of dual diagonal structure allow the encoding of the information sequence $IS_1$ using (only) the parity-check matrix $H_{r \times n}$ so that obtaining the generator matrix $G_{k \times n}$ may not be required (cf. T. J. Richardson and R. L. Urbanke, "*Efficient encoding of low-density parity-check codes*", IEEE TRANSACTIONS ON INFORMATION THEORY, Volume 47, Issue 2, Pages 638-656, August 2002).

A particular form of the parity-check matrix $H_{r \times n}$ is a regular QC-LDPC matrix ${}^{reg}H_{r \times n}^{QC}$ which can be divided into quadratic submatrices $I(p_{j,l})$, i.e. circulant matrices (or "circulants" for short), which may, for example, be obtained from cyclically right-shifting an N×N identity matrix I(0) by $p_{j,l}$ positions:

$$ {}^{reg}H_{r \times n}^{QC} = \begin{bmatrix} I(p_{0,0}) & I(p_{0,1}) & \cdots & I(p_{0,L-1}) \\ I(p_{1,0}) & I(p_{1,1}) & & I(p_{1,L-1}) \\ M & M & O & M \\ I(p_{J-1,0}) & I(p_{J-1,1}) & \cdots & I(p_{J-1,L-1}) \end{bmatrix} \quad (4)$$

with N=n/L (cf M. P. C. Fossorier, "*Quasi-Cyclic Low-Density Parity-Check Codes from Circulant Permutation Matrices*", IEEE TRANSACTIONS ON INFORMATION THEORY, Volume 50, Issue 8, Pages 1788-1793, August 2004). Thus, a regular QC-LDPC matrix ${}^{reg}H_{r \times n}^{QC}$ may be defined by a base matrix B which satisfies:

$$B = \begin{bmatrix} p_{0,0} & p_{0,1} & \cdots & p_{0,L-1} \\ p_{1,0} & p_{1,1} & & p_{1,L-1} \\ M & M & O & M \\ p_{J-1,0} & p_{J-1,1} & \cdots & p_{J-1,L-1} \end{bmatrix} \quad (5)$$

Moreover, a base matrix B of an irregular QC-LDPC matrix ${}^{irreg}H_{r \times n}^{QC}$ may be obtained by ${}^{irreg}H_{r \times n}^{QC}$=B o$M_{mask}$ where "o" denotes the Hadamard product and $$M_{mask} = \begin{bmatrix} m_{0,0} & m_{0,1} & \cdots & m_{0,L-1} \\ m_{1,0} & m_{1,1} & & m_{1,L-1} \\ M & M & O & M \\ m_{J-1,0} & m_{J-1,1} & \cdots & m_{J-1,L-1} \end{bmatrix} \quad (6)$$

denotes a mask matrix with $m_{j,l} \in \{0,1\}$. Alternatively, the base matrix B of an irregular QC-LDPC matrix ${}^{irreg}H_{r \times n}^{QC}$ may be obtained by (only) partially labelling the base matrix B with shift values $p_{j,l} \in \{0 \ldots N\}$ with not labelled entries (which are sometimes represented by a value of "−1" or an asterisk "*") representing zero matrices of size N×N.

Thus, for employing a QC-LDPC code in the encoder 12 and the decoder 14, the encoder 12 and the decoder 14 may be provided with a circulant, shift values, i.e., values corresponding to the labelled entries of the base matrix B, and (optionally) a mask matrix $M_{mask}$. For instance, an apparatus configured to choose shift values for determining a QC-LDPC matrix $H_{r \times n}^{QC}$ may provide the shift values to the encoder 12 and/or the decoder 14. Moreover, the encoder 12 and the decoder 14 may also be provided with a mask matrix $M_{mask}$ to generate one or more irregular QC-LDPC matrices ${}^{irreg}H_{r \times n}^{QC}$.

Furthermore, it is to note that a QC-LDPC matrix $H^{QC}$ (and more generally any LDPC code) can also be described by its equivalent bipartite graph ("Tanner graph"), wherein each edge of the Tanner graph connects one variable node of a plurality of variable nodes to one check node of a plurality of check nodes. For example, a QC-LDPC matrix $H_{r \times n}^{QC}$ of r rows and n columns can be represented by its equivalent bipartite graph with r check nodes and n variable nodes which has edges between the check nodes and the variable nodes if there are corresponding "1s" in the QC-LDPC matrix $H_{r \times n}^{QC}$ (cf. R. Tanner, "*A Recursive Approach to Low Complexity Codes*", IEEE TRANSACTIONS IN INFORMATION THEORY, Volume 27, Issue 5, Pages 533-547, September 1981). In this regard, it is to note that the variable nodes represent codeword bits and the check nodes represent parity-check equations.

Figure 3:
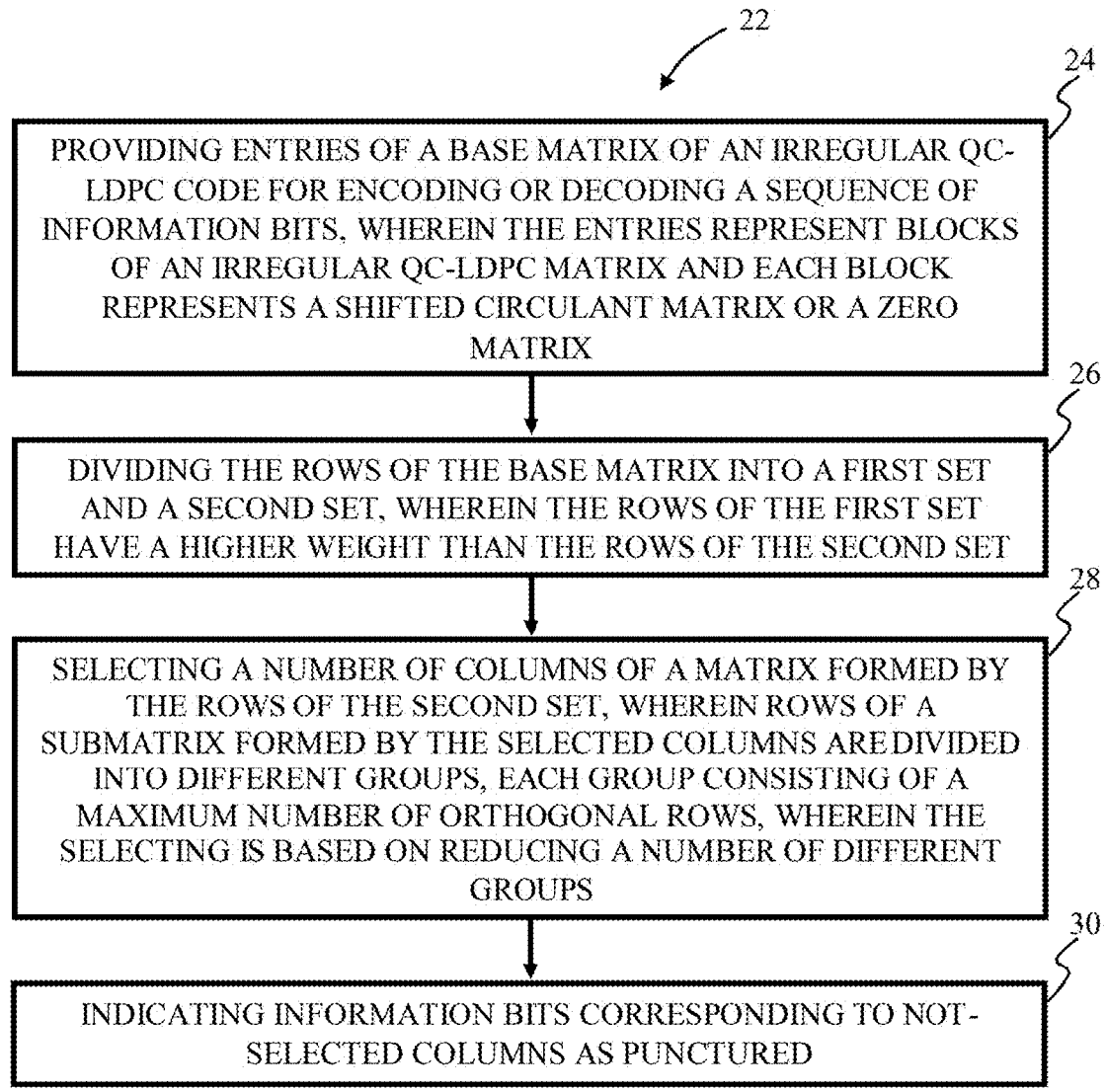
FIG. 3 shows a flow chart of a process of providing an irregular QC-LDPC code for encoding or decoding a sequence of information bits.

FIG. 3 shows a flow chart of a process 22 of providing an irregular QC-LDPC code for encoding or decoding a sequence of information bits, such as information sequence $IS_1$ and $IS_3$, respectively. The process 22 may, for example, be computer-implemented. For instance, the process 22 may be implemented by persistently stored computer-readable instructions which, if executed by a computer, cause the computer to perform the process 22. The provided base matrix B of the irregular QC-LDPC code may, for example, be provided to the encoder 12 and the decoder 14 of the digital communication system 10 and used for encoding or decoding operations performed by the encoder 12 and the decoder 14, respectively, i.e., for encoding or decoding the sequence of information bits.

Figure 4:
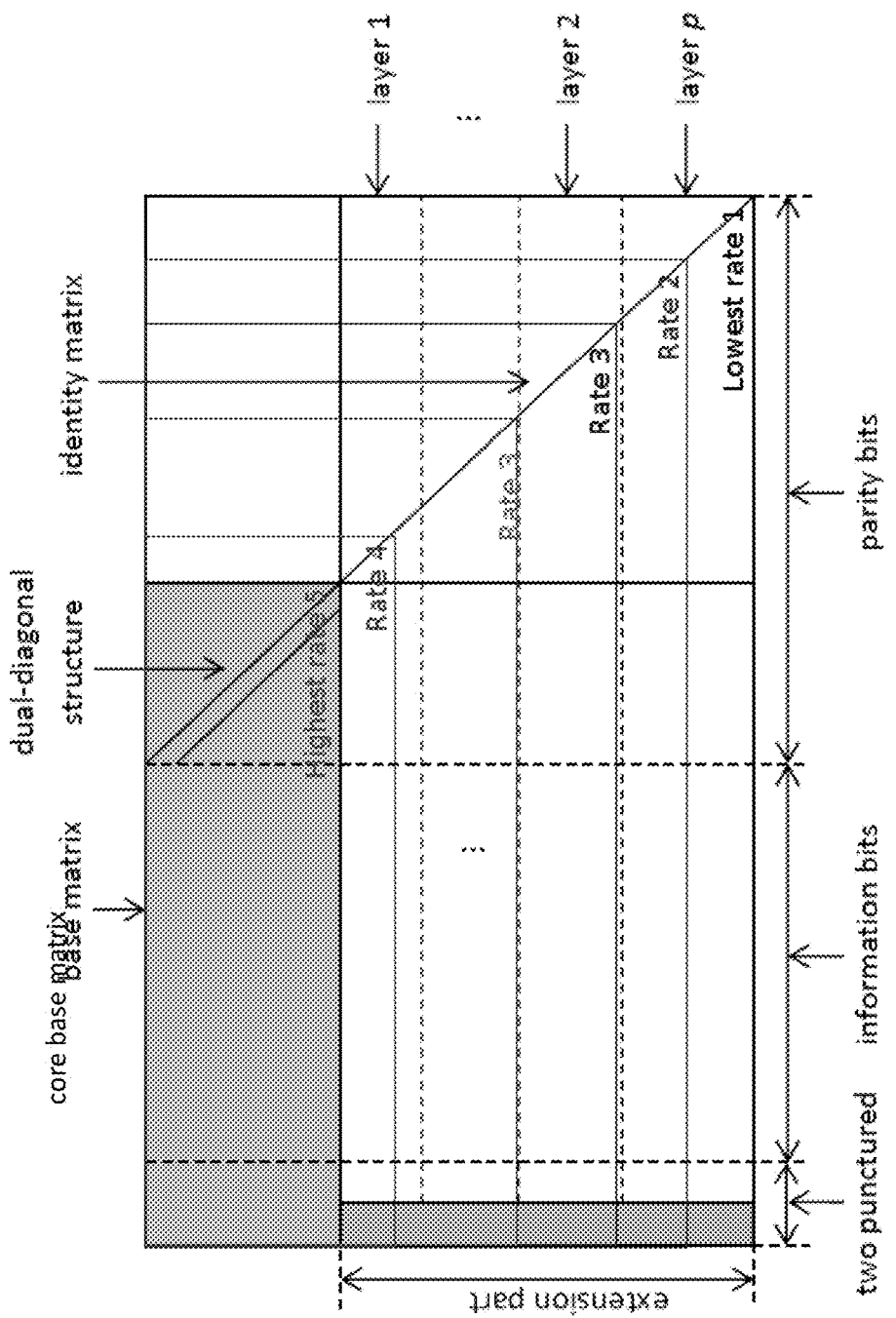
FIG. 4 shows a structure of a base matrix of an irregular QC-LDPC code.

The process 22 of providing an irregular QC-LDPC code for encoding or decoding a sequence of information bits may start at step 24 with providing entries of a base matrix B of an irregular QC-LDPC code, wherein the entries represent blocks of an irregular QC-LDPC matrix and each block represents a shifted circulant matrix or a zero matrix. A possible structure of the base matrix B is shown in FIG. 4. It comprises a "core" base matrix in the high-density part (indicated in grey on the upper left of FIG. 4). The core base matrix has a parity part with a dual diagonal structure for easy encoding. If a highest rate is required, an information sequence will be encoded using only the shift values of the core base matrix. If lower rates are acceptable, additional rows and columns can be appended to the base matrix. As shown in FIG. 4, an overlap between the additional rows and columns may form an identity matrix although a lower triangular form would also be possible. The additional rows typically have a lower weight than the rows of the core base matrix and provide (in combination with the added 'corresponding' columns) for additional parity bits in the codeword to be transmitted.

It should be noted that the base matrix B is a matrix with m rows and n columns, where m and n are integers. The base matrix B can be extended by including more columns and rows. For example, the base matrix B is a matrix with 46 rows and 68 columns, or the base matrix B is a matrix with 90 rows and 112 columns, etc. The present disclosure does not limit the size of base matrix.

The extension part comprises one, two, three, or more high-weight columns which typically have a substantially higher weight than all other columns of the extension part. For example, one, two, or all high-weight columns may have no empty cells, i.e. no entries representing the zero matrix. As shown in FIG. 4, the variable nodes corresponding to two high-weight columns are indicated as punctured and the "remaining" subrows are grouped into (non-overlapping) layers of orthogonal subrows (or row vectors).

Figure 5:
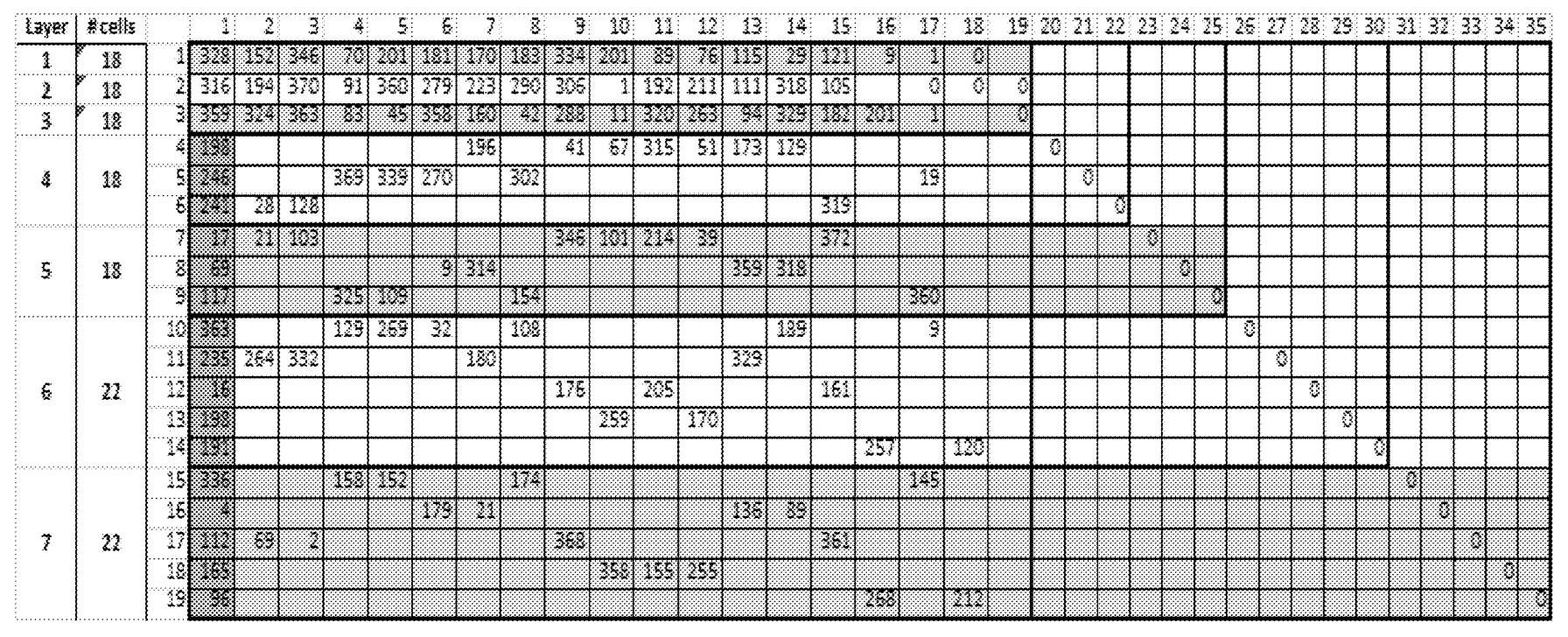

FIG. 5 shows a numeric example of provided entries of a base matrix B of size 19×35 (19 rows and 35 columns) wherein labelled entries (cells) of the base matrix B are indicated by the corresponding shift values and not-labelled entries (corresponding to zero matrices) are left blank. As shown in FIG. 5, the rows of the base matrix B can be divided into an upper part having a weight of above 17 and a lower part having a weight of below 9, i.e. less than half the weight of the rows of the upper part. Thus, the base matrix B shown in FIG. 5 can be divided into a high-density part comprising rows 1 to 3 and a low-density part comprising rows 4 to 19 as indicated at step 26 of the process 22 shown in FIG. 3.

Moreover, as shown in FIG. 5, the rows of the submatrix formed by the overlap of columns 2 to 35 and the low density-part can be divided into layers (or groups) of orthogonal rows, wherein each layer comprises about the same number of cells. Furthermore, the high-density part comprises a dual diagonal submatrix allowing to easily encode a sequence of information bits based on the non-zero columns of the high-density part. Moreover, the low-density part provides a raptor-like extension with a parity part which has a lower triangular form which allows for easy encoding of the codeword.

Figure 5A:
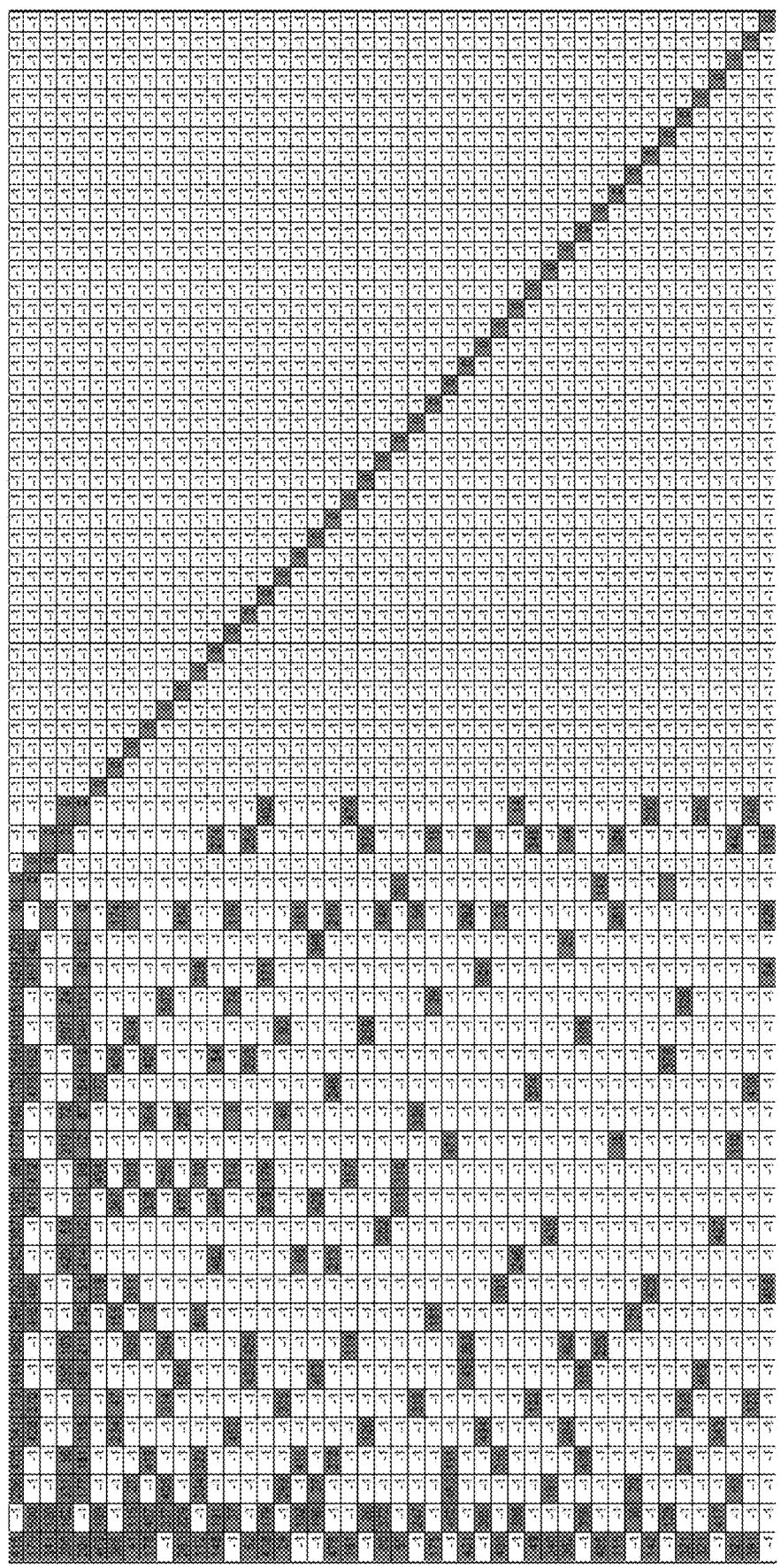
FIG. 5a shows another base matrix of an irregular QC-LDPC code.

FIG. 5a shows a numeric example of provided entries of a base matrix B of size 46×68 (46 rows and 68 columns). In FIG. 5a, labelled entries of the base matrix B are indicated by the corresponding shift values, and not-labelled entries (corresponding to zero matrices) are represented as "−1". In FIG. 5a, column 1 and 2 are punctured. For column 3 to 68, starting from row 9, there are multiple groups of orthogonal rows. The orthogonal rows are the rows not overlapped (i.e. labelled entries are not overlapped) from columnwise point of view. For example, rows 9 and 10 are orthogonal, and rows 11 and 12 are orthogonal.

Figure 6:
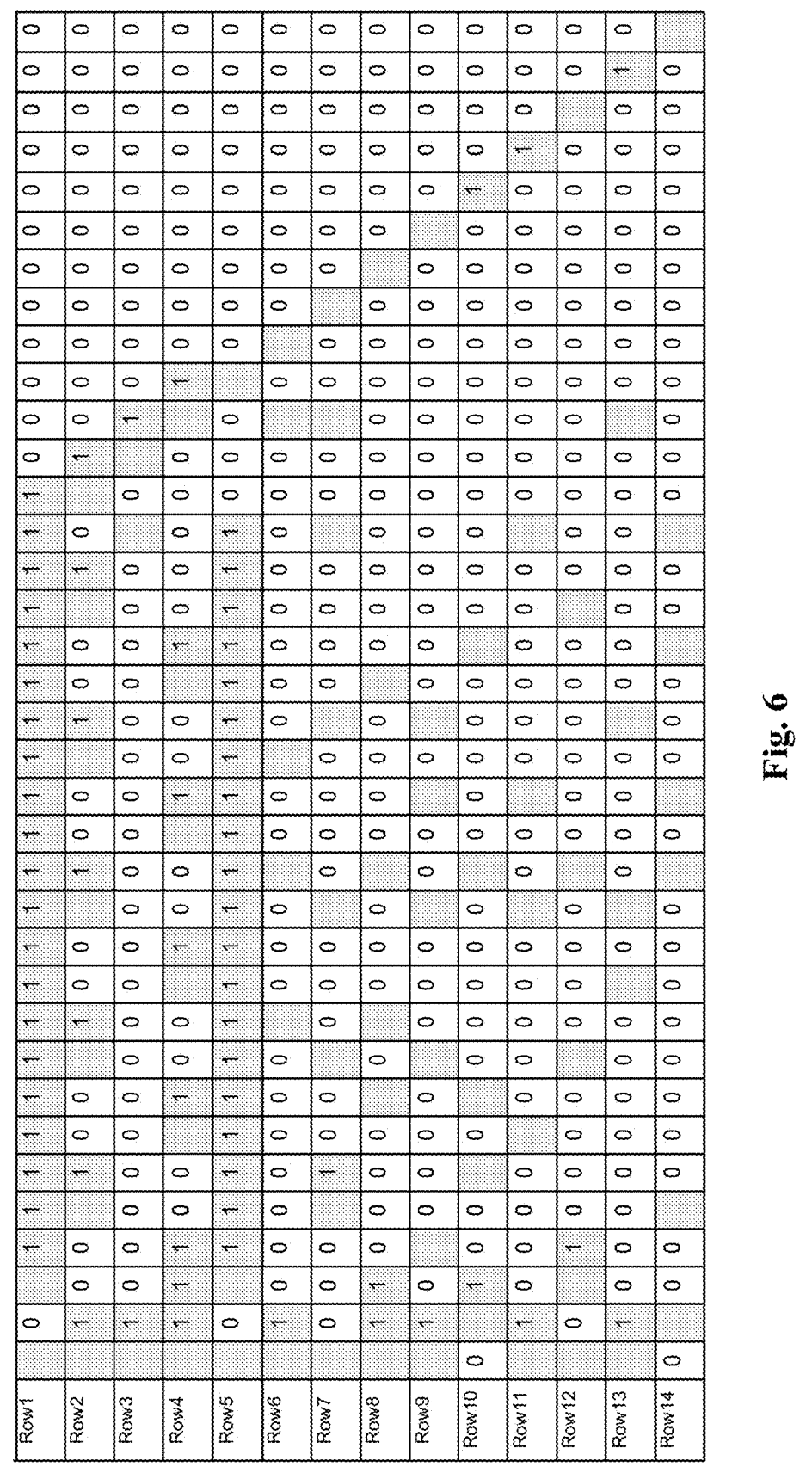
Figure 7:
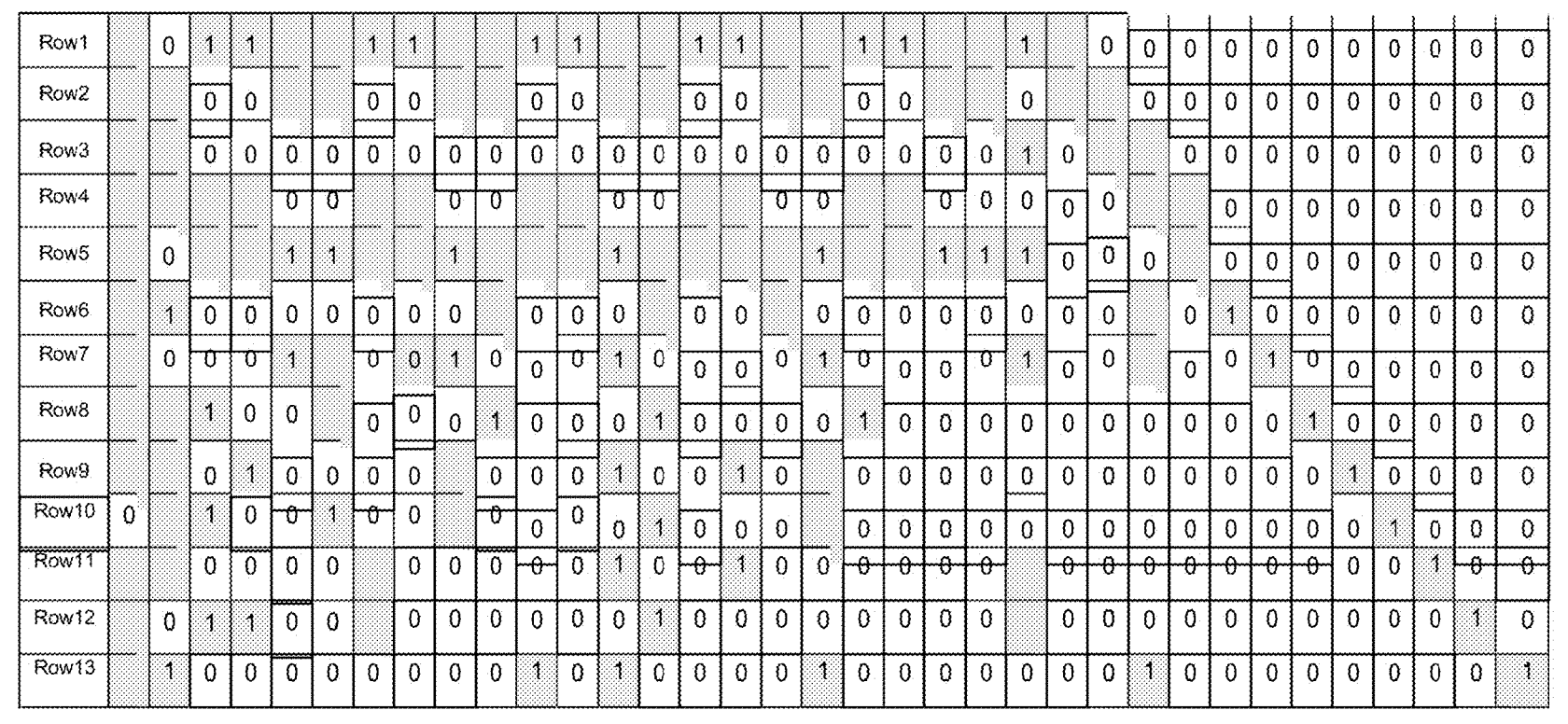

FIG. 6 and FIG. 7 show different designs of base graphs of base matrices. The term "base graph" of this disclosure includes a number of square boxes, with each square box representing an element in the base parity check matrix. Each non-zero element of the base graph is represented by a marked box (represented as "1"). Each marked box is associated with a shift value in the base matrix. In FIGS. 6 and 7, columns 1 and 2 are punctured columns. It should be noted that the punctured column can be one or more columns.

Specifically, FIG. 6 shows an example of a base graph of a base matrix with 14 rows and 36 columns. For the not-punctured (non-punctured) columns (i.e., except for columns 1 and 2), starting from row 7, i.e., from rows 7 to 14, such rows are non-conflict quasi-row orthogonal. In particular, starting from row 7, each group of rows (for example, each two adjacent rows) is non-conflict quasi-row orthogonal. As can be seen form FIG. 6, the marked boxes are not overlapped. For example, rows 7 and 8 are orthogonal, rows 9 and 10 are orthogonal, rows 11 and 12 are orthogonal, and rows 13 and 14 are orthogonal. Those rows, rows (7, 8), (9, 10) and (11, 12) are called as orthogonal rows. For the orthogonal rows, the marked box of each row are not overlapped from columnwise point of view. The group can also be called as orthogonal group.

In this embodiment, the rows of the first set are from rows 1 to 6, and the rows of the second set are starting from rows 7 to row 14. In this design, if rows 1 to 6 are considered as rows of core base matrix, and rows 7 to 14 are considered as rows of the extension part, all the rows of extension part are non-conflict quasi-row orthogonal. If rows 1 to 5 are considered as rows of core base matrix, and rows 6 to 14 are considered as rows of the extension part, most rows of the extension part away from the core base matrix are non-conflict quasi-row orthogonal.

It should be noted that the orthogonal group in FIG. 6 includes two rows. The orthogonal group can also include more than two rows. Different orthogonal groups may have identical number of rows or different number of rows.

FIG. 7 shows a base graph of a base matrix with 13 rows and 35 columns. In FIG. 7, orthogonal groups of rows extension starting from row 8. For example, rows 8 and 9 are orthogonal, rows 10 and 11 are orthogonal, and rows 12 and 13 are orthogonal. The orthogonal groups in FIG. 7 comprise adjacent two orthogonal rows, i.e. rows 8 and 9, rows 10 and 11, and rows 12 and 13. In this embodiment, each group has two orthogonal rows. It can also be modified to make each group have different number of rows., for example, three orthogonal rows, or four orthogonal rows and so on.

As further indicated at step 28 of the process 22 illustrated in FIG. 3, column 1 of the base matrix B is punctured. After encoding a sequence of information bits by the encoder 12 based on the provided entries of the base matrix B and transmitting the corresponding codeword (except for the information bits corresponding to the punctured nodes) via the channel 18 to the decoder 14, the encoder 14 may iteratively decode the received information bits using a normalized Min-Sum decoding process combining flooding and layered decoding steps as illustrated by steps A, B, and C of FIG. 8, FIG. 9, and FIG. 10. Moreover, in the decoding process, it can be taken advantage of the fact that the shift values of the punctured column that correspond to the extended part of the matrix (shown in dark grey in FIG. 5) can be set to zeros using row and column shifting operations. Furthermore, parallelism of the decoding operation can be increased by providing for groups of orthogonal rows in the portion of the dense part to which layered decoding steps are applied (i.e., the part corresponding to the not-punctured columns).

Figure 8:
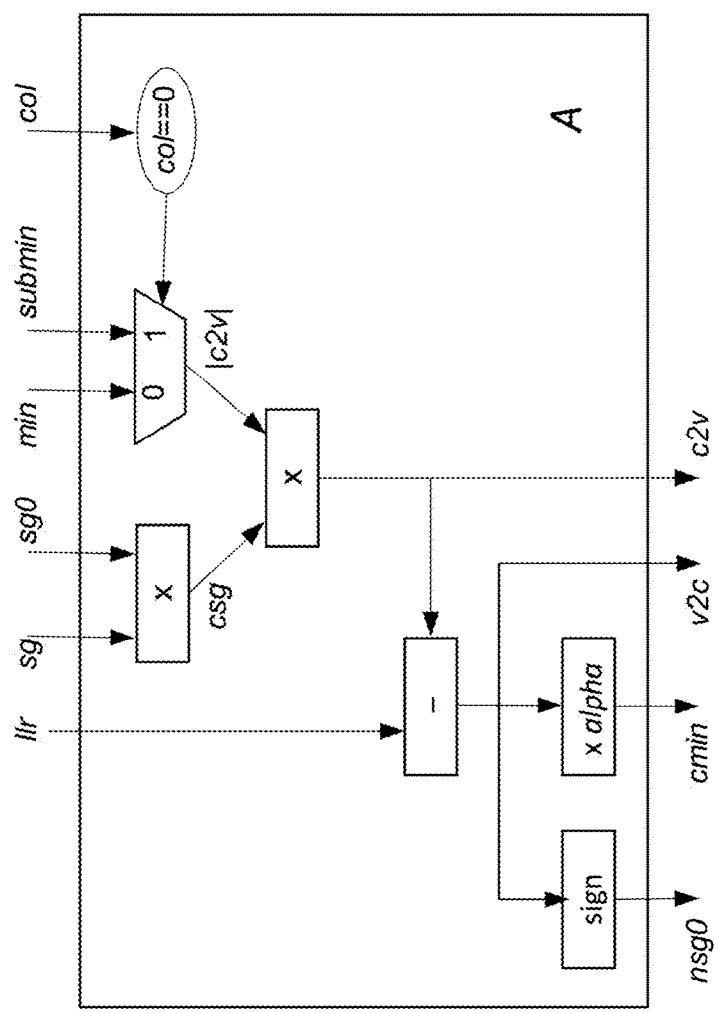
FIG. 8 shows a first part of a flow chart of a decoding process.

As indicated by step A shown in FIG. 8, the log-likelihood-ratios (llr-s) of the punctured columns are calculated using the following formulas with llr, $sg0_j$, $sg_j$, $min_j$, $submin_j$, $col_j$, $v2c_j$, $csg_j$, $c2v_j$, $nsg0_j$, $cmin_j$, $psg_j$, $pmin_j$, $psubmin_j$, $pcol_j$, $nsg_j$, $nmin_j$, $nsubmin_j$, $ncol_j$, and $nc2v_j$ being vectors of length N and alpha denoting the scale parameter of the normalized Min-Sum decoding process:

llr denotes the vector of llr-s of the punctured node, which may be stored in application-specific integrated circuit (ASIC) registers.

$sg0_j$ denotes the signs of the variable to check messages (v2c) of the punctured nodes and the j-th row inside a group, which may be stored in random access memory (RAM).

$sg_j$, $min_j$, $submin_j$, $col_j$ denote multiplications of signs, minimums, sub-minimums and zero-based argMinimums in the j-th row of the given orthogonality group with $1<=j<=n$. All these values may be calculated before starting the decoding process and stored in memory.

$psg_j$, $pmin_j$, $psubmin_j$, $pcol_j$ denote updated multiplications of signs, minimums, sub-minimums and argMinimums in the j-th row of current orthogonality group. These values are to be determined for each column but the punctured one.

First, $csg_j$, $c2v_1$, and $c2v$ are calculated for $1<=j<=n$ by:

$$csg_j = sg_j * sg0_j,$$

$$|c2v_j| = (col_j == 0)?\ submin_j:\ min_j,\ \text{and}$$

$$c2v = csg * |c2v|.$$

Then, $nsg0_j$, $cmin_j$, and $v2c_j$, are calculated by:

$$nsg0_j = \text{sign}(v2c_j),$$

$$cmin_j = |v2c_j| * \text{alpha},$$

$$v2c_j = llr - c2v_j.$$

Figure 9:
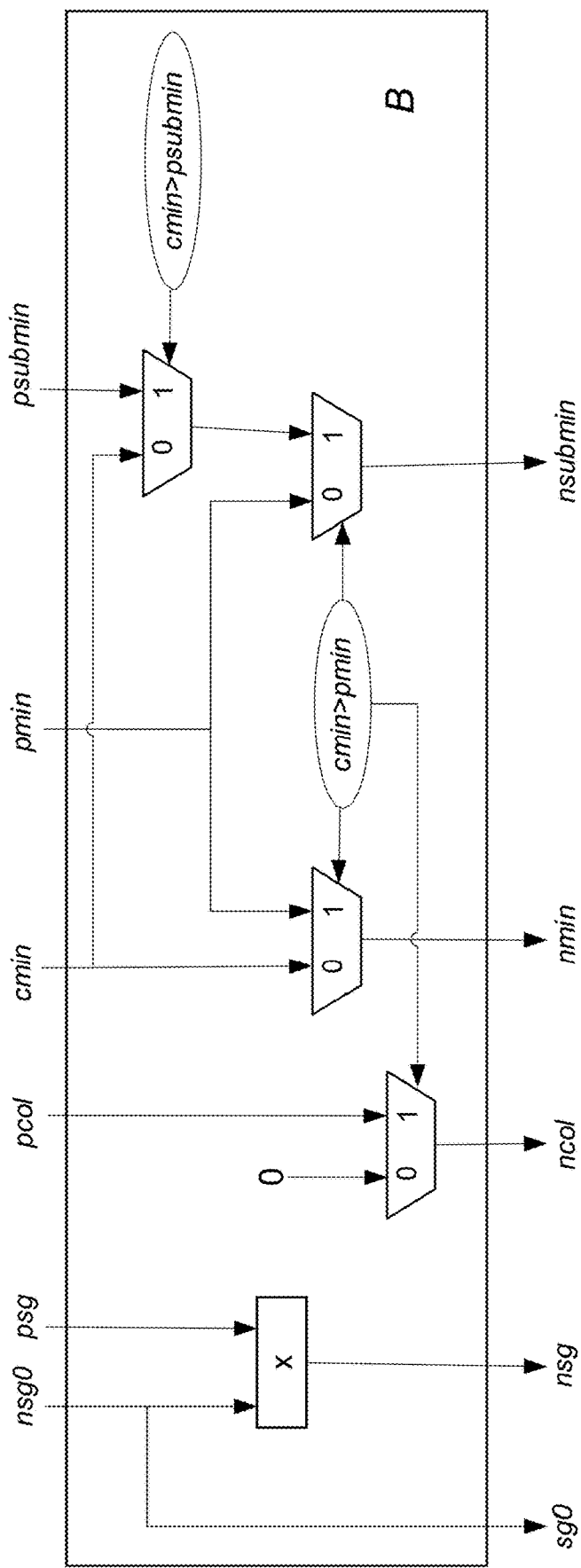
FIG. 9 shows a second part of the flow chart of the decoding process.

Now, as indicated by step B shown in FIG. 9, new minimums, sub-minimums and argMinimums, as well as signs of the punctured column in each row of the current orthogonality group are calculated for $1<=j<=n$ by:

$$sg0_j = nsg0_j$$

$$nsg_j = nsg0_j * psg_j,$$

$$ncol_j = (cmin_j > pmin_j)?\ pcol_j:\ 0,$$

$$nmin_j = (cmin_j > pmin_j)?\ pmin_j:\ cmin_j,\ \text{and}$$

$$nsubmin_j = (cmin_j > pmin_j)?\ ((cmin_j > psubmin_j)?\ psubmin_j:\ cmin_j):\ pmin_j.$$

These values are stored in memory where $sg_j$, $min_j$, $submin_j$, $col_j$, and $sg0_j$ replace the currently stored values for the next decoding iteration.

Figure 10:
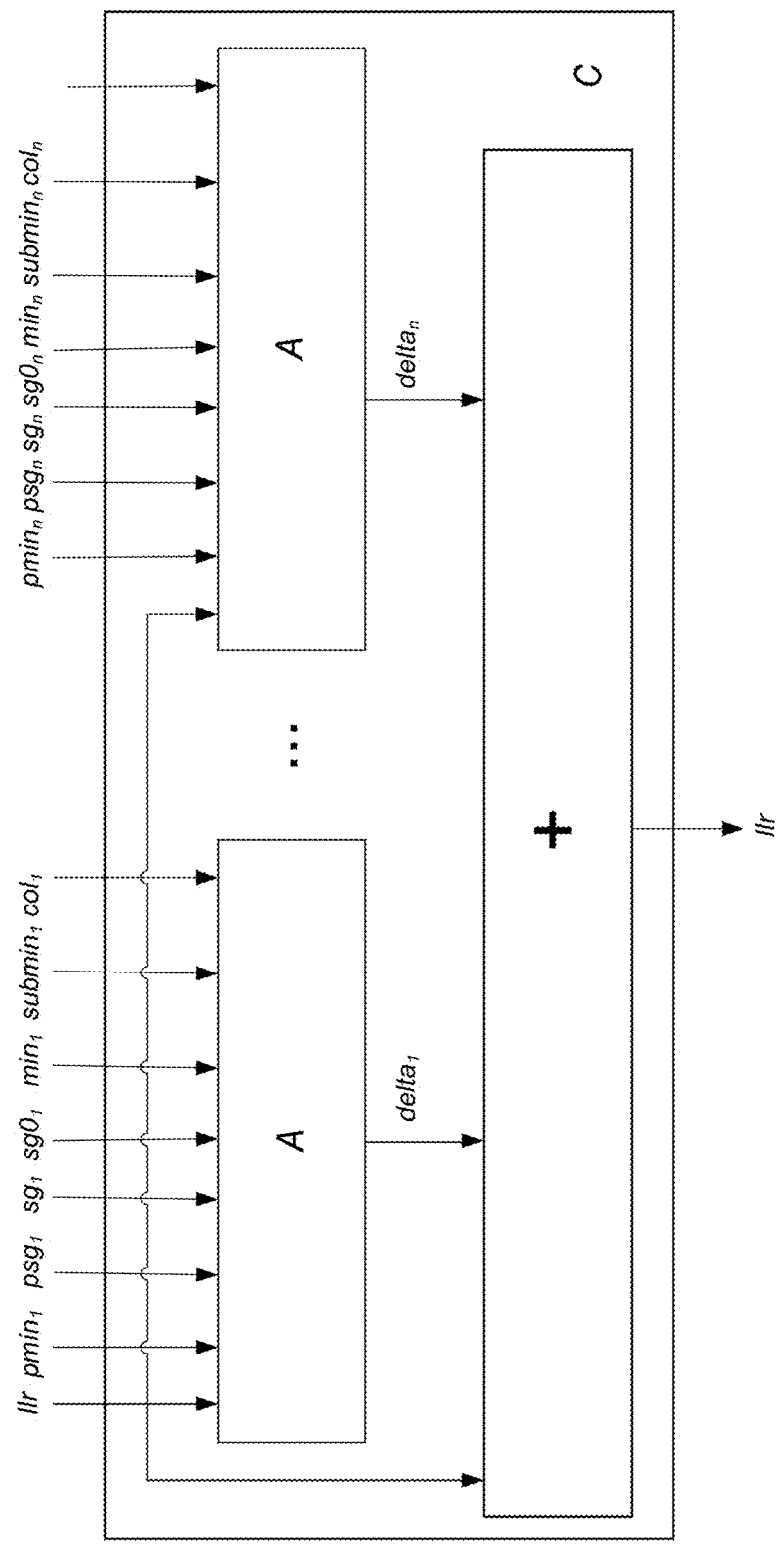
FIG. 10 shows a third part of the flow chart of the decoding process.

Finally, psum, c2vsum, and the new llr-s of the punctured node are calculated as indicated by step C shown in FIG. 10 by:

$$psum = psg_1 * pmin_j + \ldots + psg_n * pmin_n,$$

$$c2vsum = c2v_1 + \ldots + c2v_n,\ \text{and}$$

$$llr = llr - c2vsum + psum.$$

Moreover, the proposed scheme can be efficiently implemented in hardware as will become apparent from the following example in which each group of orthogonal rows is processed in 3 clock cycles, all llr-s are stored in registers, the number of available processors equals the number of columns of the QC-LDPC matrix and $sg_j$, $min_j$, $submin_j$, $col_j$ are loaded to registers before the $1^{st}$ clock cycle begins.

Processing of the non-punctured columns is done using the same scheme, and processing of the punctured column is done according to the above described formulas:

Clock cycle 1. For all columns but the punctured one, c2v messages are calculated. The calculated c2v messages are subtracted from llr-s, so that v2c messages are obtained which are stored in the same registers in which the llr-s were stored. The obtained v2c messages are used to determine nsg0 and cmin which are used for determining partial minimums. Also, at the clock cycle 1, llr-s of the punctured columns of the previous group are obtained according. After that, these llr-s are shifted and stored on registers. As a result, llr-s of the punctured columns are calculated 1 clock cycle later that llr-s of other columns, but they are also used 1 clock cycle later (at the second clock cycle).

Clock cycle 2. Minimums (i.e. $psg_j$, $pmin_j$, $psubmin_j$, $pcol_j$) are calculated from the partial minimums. Also, nsg0, cmin and c2v are calculated for the punctured column. After that, values of $nsg_j$, $nmin_j$, $nsubmin_j$, $ncol_j$ are calculated and stored in memory.

Clock cycle 3. From the obtained values of $nsg_j$, $nmin_j$, $nsubmin_j$, $ncol_j$ for all columns but the punctured ones, new c2v messages can be calculated. After that, these values are summed up with v2c-messages and llr-s of all non-punctured columns are obtained. The obtained llr-s are then stored in registers. Also, at this clock cycle, psum and c2vsum are calculated.

If more than one column of the base matrix is indicated as punctured, the above modified Min-Sum decoding process is to be extended accordingly. For example, processing of two punctured columns can be done according to the following scheme:

Clock cycle 1a) For all non-punctured columns c2v messages are calculated. c2v messages are subtracted from llr-s. As a result, v2c messages are obtained that can be stored on the same registers as llr-s. These v2c messages can be used to get values of nsg0 and cmin. These values are used to get partial minimums.

Clock cycle 1b) Also at the $1^{st}$ clock cycle llr-s of the 2 punctured columns can be obtained for the previous orthogonality group. After that, these llr-s can be shifted and stored in registers. As a result, llr-s for the punctured columns can be obtained 1 clock later but causes no problem because they are needed 1 clock later.

Clock cycle 2a) Minimums are collected from partial minimums, i.e. values for $psg_j$, $pmin_j$, $psubmin_j$, and $pcol_j$ are obtained.

Clock cycle 2b) At this clock cycle nsg0, cmin and c2v are calculated for 2 punctured columns. After that, the values of $nsg_j$, $nmin_j$, $nsubmin_j$, and $ncol_j$ are calculated and stored in memory.

Clock cycle 3a) From the obtained values of $nsg_j$, $nmin_j$, $nsubmin_j$, $ncol_j$ for all non-punctured columns, messages c2v are calculated, which after being summed up with v2c messages, llr-s of all non-punctured columns are given. The llr-s are shifted and stored in registers.

Clock cycle 3b). At this clock cycle, messages nc2v and sums c2vsum and nc2vsum are calculated.

If using above described scheme, a special processor for puncture nodes may be needed for steps 1a), 2a), 3a), and also a processor may be needed for each not-punctured (non-punctured) column which performs operations 1b), 2b), 3b). If the QC-LDPC matrix has m groups of orthogonal subrows, 3*m Clocks per iteration may be required. Every sub-processor 1a), 2a), 3a), 1b), 2b), 3b) will have a stall for 2 clocks from 3 available.

Another even more memory efficient scheme may be used with 4 clocks per processor but less processors (1 processor for the punctured columns and one processors for four not-punctured columns).

Clock Ia) Calculations from 1a) are performed for a first quarter of the non-punctured columns.

Clock Ib) llr-s of punctured columns of the first row of the previous group are calculated. After that, the llr-s are shifted and stored in registers.

Clock IIa) Actions of 2a) are performed for the non-punctured columns and actions of 1a) are performed for a second quarter of the non-punctured columns.

Clock IIb) nsg0, cmin and c2v are calculated for the punctured columns and $nsg_j$, $nmin_j$, $nsubmin_j$, and $ncol_j$ are obtained and stored in registers.

Clock IIIa) Actions of 3a) are performed for the first quarter of not-punctured (non-punctured). Actions of 2a) are performed for the second quarter of the not-punctured (non-punctured) columns. Actions of 1a) are performed for a third quarter of not-punctured (non-punctured) columns.

Clock IIIb) Values of $nsg_j$, $nmin_j$, $nsubmin_j$, and $ncol_j$ are determined and stored in memory. Also, c2vsum sums are calculated.

Clock IVa) Actions of 3a) are performed for the second quarter of the non-punctured columns. Actions of 2a) are performed for the third quarter of the non-punctured columns. Actions of 1a) are performed for the fourth quarter of the non-punctured columns.

Clock IVb) Messages nc2v and sums nc2vsum are calculated.

A generalization of this approach is possible, if, for example, the number of processors is decreased and the throughput is decreased correspondingly.

When denoting the processing steps with letters A-I:

A—Calculating c2v for non-punctured nodes. Determining and storing v2c in registers replacing llr-s. Calculating nsg0 and cmin. Calculating partial minimums.

B—Getting minimums from partial minimums, i.e. $psg_j$, $pmin_j$, $psubmin_j$,

C—Calculating new c2v from $nsg_j$, $nmin_j$, $nsubmin_j$, $ncol_j$ for all non-punctured nodes, summing them up with v2c to obtain llr-s of these columns, shifting them and storing in registers.

D—Calculating nsg0, cmin and c2v for punctured nodes.

E—Determining $nsg_j$, $nmin_j$, $nsubmin_j$, and $ncol_j$.

F—Calculating c2vsum.

G—Calculating nc2vsum.

H—Calculating nc2v.

I—Calculating llr-s of punctured columns. Shifting and storing them in registers.

and having, for example, three groups of orthogonal subrows (in the high-density and the low-density part) each comprising two orthogonal rows which are denoted as:

1-2—$1^{st}$ group 3-4—$2^{nd}$ group 5-6—$3^{rd}$ group and twelve not-punctured (non-punctured) columns with:

j.1—first half of non-empty cells in the j-th row, $1<=j<=6$ and j.2—second half of non-empty cells of the j-th row, $1<=j<=6$, wherein actions A, B, and C are performed for non-punctured columns and actions D, E, F, G, H, and I are performed for punctured columns, FIGS. 11 and 12 depict the schedule for the 3-clock cycle scheme and the schedule for the 4-clock cycle scheme. As can be seen from FIGS. 11 and 12, high parallelism can be achieved.

Moreover, it is to be noted that in addition to enabling the encoder 12 and the decoder 14 to perform encoding and decoding operations on basis of the provided base matrix B, the encoder 12 and the decoder 14 may also use the provided base matrix B to derive irregular QC-LDPC child codes of different rates in accordance with different transmission scenarios, e.g., transmission scenarios which differ from each other in view channel quality and/or throughput requirements, by, for instance, removing (or neglecting) rows of the low-density part and/or columns of the parity part of the provided base matrix B.

The at least one processor configured to perform functions of the encoder or decoder, or base station, the terminal, or the core network apparatus in embodiments of the present disclosure may be a central processing unit (CPU), a general purpose processor, a digital signal processor (DSP), an application-specific integrated circuit (ASIC), a field programmable gate array (FPGA) or another programmable logical device, a transistor logical device, a hardware component, or any combination thereof. The controller/processor may implement or execute various example logical blocks, modules, and circuits described with reference to content disclosed in embodiments of the present disclosure. Alternatively, the processor may be a combination of processors implementing a computing function, for example, a combination of one or more microprocessors, or a combination of the DSP and a microprocessor.

The steps of the method or algorithm described with reference to the content disclosed in embodiments of the present disclosure may be directly implemented by using hardware, a software module executed by a processor, or a combination thereof. The software module may be located in a RAM memory, a flash memory, a ROM memory, an EPROM memory, an EEPROM memory, a register, a hard disk, a portable disk, a CD-ROM, or any other form of storage mediums known in the art. For example, a storage medium is coupled to a processor, so that the processor can read information from the storage medium or write information into the storage medium. Certainly, the storage medium may also be a component of the processor. The processor and the storage medium may be located in the ASIC. In addition, the ASIC may be located in user equipment. Certainly, the processor and the storage medium may exist in the user equipment as discrete components.

The parameters associated with the base matrix, the base matrix, or a matrix extended based on the base matrix can be stored in a memory. The memory can be independent with the at least one processor. The memory can also be integrated in the at least one processor. The memory is one kind of a computer-readable storage medium.

All or some of the foregoing embodiments may be implemented by means of software, hardware, firmware, or any combination thereof. When a software program is used to implement the embodiments, the embodiments may be implemented completely or partially in a form of a computer program product. The computer program product includes one or more computer instructions. When the computer program instructions are loaded and executed on the computer, the procedure or functions according to the embodiments of the present disclosure are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server or a data center, integrating one or more usable media. The usable medium may be a magnetic medium (for example, a soft disk, a hard disk, or a magnetic tape), an optical medium (for example, a digital versatile disc (DVD)), a semiconductor medium (for example, a Solid State Disk (SSD)), or the like.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus for wireless communication, comprising:
at least one processor configured to:
obtain a sequence to be decoded;
obtain a matrix for decoding the sequence; and
decode the sequence using the matrix to produce a decoded sequence,
wherein
the matrix is determined according to a base matrix,
wherein the base matrix comprises a plurality of entries that representing blocks of the matrix, and each block of the matrix represents a shifted circulant matrix or a zero matrix,
wherein each entry of the base matrix corresponding to the shifted circulant matrix is indicated by a shift value,
wherein the base matrix comprises multiple columns and multiple rows, the multiple rows comprise a first set of rows starting from a first row of the base matrix and a second set of rows following the first set of rows, and the multiple columns comprise at least one punctured column and multiple non-punctured columns,
wherein a number of entries indicated by shift values in each row of the first set of rows is larger than a number of entries indicated by shift values in each row of the second set of rows,
wherein a number of entries indicated by shift values in each column of the at least one punctured column is larger than a number of entries indicated by shift values in each column of the multiple non-punctured columns,
wherein the second set of rows comprises at least one group, each of the at least one group comprising at least two consecutive rows, and
wherein in the at least two consecutive rows, at least one column of the at least one punctured column has at least two entries indicated by shift values, and each column of the multiple non-punctured columns has at most one entry indicated by a shift value.

2. The apparatus according to claim 1, wherein each shift value defines a number of times to be cyclically right-shifted for an identity matrix.

3. The apparatus according to claim 1, further comprising a memory configured to store parameters associated with the base matrix.

4. The apparatus according to claim 1, wherein the apparatus for wireless communication is installed in a terminal device.

5. The apparatus according to claim 1, wherein the apparatus for wireless communication is installed in a base station.

6. The apparatus according to claim 1, wherein the at least one processor is configured to obtain the sequence to be decoded in accordance with a signal received through a wireless channel.

7. The apparatus according to claim 1, wherein each row for the multiple non-punctured columns in a last portion of the second set of rows has at most one entry indicated by a shift value.

8. The apparatus according to claim 1, wherein in any adjacent two rows, each column of the multiple non-punctured columns has at most one entry indicated by a shift value.

9. The apparatus according to claim 1, wherein the at least one group is two or more groups, and the two or more groups are consecutive.

10. The apparatus according to claim 1, wherein the base matrix comprises 46 rows and 68 columns.

11. The apparatus according to claim 1, wherein the at least one punctured column is two punctured columns.

12. The apparatus according to claim 11, wherein a first column and a second column of the base matrix are the two punctured columns.

13. The apparatus according to claim 1, wherein a subset of columns of a matrix formed by the first set of rows has a dual diagonal or triangular structure, and wherein a subset of columns of a matrix formed by the second set of rows has a triangular or identity matrix structure.

14. The apparatus according to claim 1, wherein the at least one processor is configured to decode the sequence to be decoded based on a flooding decoding process for variable nodes corresponding to the at least one punctured column and a layered decoding process for nodes corresponding to the multiple non-punctured columns.

15. A method for wireless communication, comprising:
obtaining a sequence to be decoded; and
obtaining a matrix for decoding the sequence; and
decoding the sequence using the matrix to produce a decoded sequence,
wherein
the matrix is determined according to a base matrix,
wherein the base matrix comprises a plurality of entries that representing blocks of the matrix, and each block of the matrix represents a shifted circulant matrix or a zero matrix,
wherein each entry of the base matrix corresponding to the shifted circulant matrix is indicated by a shift value,
wherein the base matrix comprises multiple columns and multiple rows, the multiple rows comprise a first set of rows starting from a first row of the multiple rows and a second set of rows following the first set of rows, and the multiple columns comprise at least one punctured column and multiple non-punctured columns,
wherein a number of entries indicated by shift values in each row of the first set of rows is larger than a number of entries indicated by shift values in each row of the second set of rows,
wherein a number of entries indicated by shift values in each column of the at least one punctured column is larger than a number of entries indicated by shift values in each column of the multiple non-punctured columns,
wherein the second set of rows comprises at least one group, each of the at least one group comprising at least two consecutive rows, and
wherein in the at least two consecutive rows, at least one column of the at least one punctured column has at least two entries indicated by shift values, and each column of the multiple non-punctured columns has at most one entry indicated by a shift value.

16. The method according to claim 15, wherein each shift value defines a number of times to be cyclically right-shifted for an identity matrix.

17. The method according to claim 15, wherein the decoding the sequence using the matrix to produce a decoded sequence comprises decoding the sequence based on a flooding decoding process for variable nodes corresponding to the at least one punctured column and a layered decoding process for nodes corresponding to the non-punctured columns.

18. The method according to claim 15, further comprising storing parameters associated with the base matrix.

19. A non-transitory computer-readable storage medium storing instructions, which when run on a computer, cause the computer to perform steps comprising:
obtaining a sequence to be decoded;
obtaining a matrix for decoding the sequence; and
decoding the sequence using the matrix to produce a decoded sequence,
wherein
wherein the matrix is determined according to a base matrix,
wherein the base matrix comprises a plurality of entries that representing blocks of the matrix, and each block of the matrix represents a shifted circulant matrix or a zero matrix,
wherein each entry of the base matrix corresponding to the shifted circulant matrix is indicated by a shift value,
wherein the base matrix comprises multiple columns and multiple rows, the multiple rows comprise a first set of rows starting from a first row of the base matrix and a second set of rows following the first set of rows, and the multiple columns comprise at least one punctured column and multiple non-punctured columns,
wherein a number of entries indicated by shift values in each row of the first set of rows is larger than a number of entries indicated by shift values in each row of the second set of rows,
wherein a number of entries indicated by shift values in each column of the at least one punctured column is larger than a number of entries indicated by shift values in each column of the multiple non-punctured columns,
wherein the second set of rows comprises at least one group, each of the at least one group comprising at least two consecutive rows, and
wherein in the at least two consecutive rows, at least one column of the at least one punctured column has at least two entries indicated by shift values, and each column of the multiple non-punctured columns has at most one entry indicated by a shift value.

20. The non-transitory computer-readable storage medium according to claim 19, wherein the decoding the sequence using the matrix to produce a decoded sequence comprises: decoding the sequence based on a flooding decoding process for variable nodes corresponding to the at least one punctured column and a layered decoding process for nodes corresponding to the non-punctured columns.

* * * * *

UNITED STATES PATENT AND TRADEMARK OFFICE
CERTIFICATE OF CORRECTION

PATENT NO. : 11,265,014 B2
APPLICATION NO. : 16/749453
DATED : March 1, 2022
INVENTOR(S) : Shutkin et al.

It is certified that error appears in the above-identified patent and that said Letters Patent is hereby corrected as shown below:

In the Claims

Claim 19, Column 18, Line 15: "wherein the matrix" should read -- the matrix --.

Signed and Sealed this
Nineteenth Day of July, 2022

Katherine Kelly Vidal
*Director of the United States Patent and Trademark Office*